(12) United States Patent
Tokuda et al.

(10) Patent No.: US 10,033,006 B2
(45) Date of Patent: Jul. 24, 2018

(54) CARBON FIBER-CONDUCTIVE POLYMER TRANSPARENT ELECTRODE

(71) Applicant: NIPPON STEEL & SUMITOMO METAL CORPORATION, Tokyo (JP)

(72) Inventors: Ikumi Tokuda, Tokyo (JP); Taihei Kaneto, Tokyo (JP)

(73) Assignee: Nippon Steel & Sumitomo Metal Corporation, Tokyo (JP)

(*) Notice: Subject to any disclaimer, the term of this patent is extended or adjusted under 35 U.S.C. 154(b) by 0 days.

(21) Appl. No.: 15/300,622

(22) PCT Filed: Apr. 6, 2015

(86) PCT No.: PCT/JP2015/060765
§ 371 (c)(1),
(2) Date: Sep. 29, 2016

(87) PCT Pub. No.: WO2015/152425
PCT Pub. Date: Oct. 8, 2015

(65) Prior Publication Data
US 2017/0125713 A1  May 4, 2017

(30) Foreign Application Priority Data

Apr. 4, 2014  (JP) .................. 2014-078063
Oct. 9, 2014  (JP) .................. 2014-208285

(51) Int. Cl.
H01L 51/44  (2006.01)
B32B 15/04  (2006.01)
B32B 27/20  (2006.01)

(52) U.S. Cl.
CPC ............ H01L 51/444 (2013.01); B32B 15/04 (2013.01); B32B 27/20 (2013.01);
(Continued)

(58) Field of Classification Search
CPC ............................. H01L 51/444; H01L 51/44
See application file for complete search history.

(56) References Cited

U.S. PATENT DOCUMENTS 5,111,178 A * 5/1992 Bosze ............... H01B 1/22
338/160
6,420,031 B1 * 7/2002 Parthasarathy ...... C07D 487/22
313/504

(Continued)

FOREIGN PATENT DOCUMENTS

CN  101599316 A  12/2009
CN  101870705 A  10/2010
(Continued)

OTHER PUBLICATIONS

Ali et al., "Realization of solution processed multi-layer bulk heterojunction organic solar cells by electro-spray deposition", Organic Electronics 13 (2012), pp. 2130-2137.
(Continued)

Primary Examiner — Caridad Everhart
Assistant Examiner — Christina Sylvia
(74) Attorney, Agent, or Firm — Birch, Stewart, Kolasch & Birch, LLP

(57) ABSTRACT

A transparent electrode includes a conductive polymer layer, and plural carbon fibers having a diameter larger than the thickness of the conductive polymer layer, in which the carbon fibers are partially embedded in the conductive polymer layer. An organic electronic device includes the transparent electrode.

12 Claims, 4 Drawing Sheets

(52) U.S. Cl.
CPC ... *B32B 2262/106* (2013.01); *B32B 2307/202* (2013.01); *B32B 2307/412* (2013.01); *B32B 2457/00* (2013.01)

(56) References Cited

U.S. PATENT DOCUMENTS

| | | | |
|---|---|---|---|
| 9,607,726 B2* | 3/2017 | Wu | H01B 1/22 |
| 2003/0122476 A1* | 7/2003 | Wang | H05B 33/04 |
| | | | 313/493 |
| 2004/0187917 A1 | 9/2004 | Pichler | |
| 2006/0024579 A1* | 2/2006 | Kolosnitsyn | H01M 4/13 |
| | | | 429/209 |
| 2006/0257638 A1 | 11/2006 | Glatkowski et al. | |
| 2007/0057623 A1 | 3/2007 | Hikmet et al. | |
| 2007/0065651 A1 | 3/2007 | Glatkowski et al. | |
| 2009/0305055 A1 | 12/2009 | Shimizu | |
| 2010/0051101 A1* | 3/2010 | Kim | B82Y 10/00 |
| | | | 136/256 |
| 2010/0255323 A1* | 10/2010 | Nakamura | H01B 1/22 |
| | | | 428/457 |
| 2010/0270914 A1 | 10/2010 | Kamatani et al. | |
| 2012/0027994 A1 | 2/2012 | Takada et al. | |
| 2012/0145968 A1 | 6/2012 | Shimizu | |
| 2013/0323602 A1 | 12/2013 | Matsunaga et al. | |
| 2014/0246225 A1 | 9/2014 | Mizuno et al. | |

FOREIGN PATENT DOCUMENTS

| | | |
|---|---|---|
| JP | 2006-527454 A | 11/2006 |
| JP | 2007-112133 A | 5/2007 |
| JP | 2007-280841 A | 10/2007 |
| JP | 2009-123396 A | 6/2009 |
| JP | 2011-86482 A | 4/2011 |
| JP | 2011-204723 A | 10/2011 |
| JP | 2012-97343 A | 5/2012 |
| JP | 2012-124107 A | 6/2012 |
| JP | 2012-201951 A | 10/2012 |
| JP | 2012-216535 A | 11/2012 |
| JP | 2012-219333 A | 11/2012 |
| JP | 2013-152579 A | 8/2013 |
| JP | 2013-185137 A | 9/2013 |
| JP | 2013-206809 A | 10/2013 |
| WO | WO 2010/106899 A1 | 9/2010 |
| WO | WO 2012/083755 A1 | 6/2012 |

OTHER PUBLICATIONS

International Search Report for PCT/JP2015/060765 (PCT/ISA/210) dated Jun. 23, 2015.
Office Action issued in corresponding Japanese Patent Application No. 2015-533782 dated Oct. 27, 2015.
Written Opinion of the International Searching Authority for PCT/JP2015/060765 (PCT/ISA/237) dated Jun. 23, 2015.
The State Intellectual Property of the People's Republic of China, "First Notification of Reason for Rejection," issued in connection with Chinese Patent Application No. 201560017968.6, dated Feb. 23, 2017.
Extended European Search Report, dated Nov. 7, 2017, for corresponding European Application No. 15774302.2.

* cited by examiner

CARBON FIBER-CONDUCTIVE POLYMER TRANSPARENT ELECTRODE

TECHNICAL FIELD

The present invention relates to a transparent electrode utilized in an organic electronic device of which typical examples include organic solar cells and organic electroluminescence elements, and to an organic electronic device in which the transparent electrode is utilized.

BACKGROUND ART

Transparent electrodes are utilized in organic electronic devices. Such a transparent electrode is arranged on a light-receiving surface side of a photoelectric conversion element of which typical examples include organic solar cells. Such a transparent electrode is arranged on a light-emitting surface side of a light-emitting element of which typical examples include organic EL (electroluminescence) elements.

Indium tin oxide (ITO) has been frequently used as a transparent electrode material. ITO contains indium oxide ($In_2O_3$) and a small percent of tin oxide ($SnO_2$).

A method of producing a transparent electrode comprising ITO is disclosed in, for example, Document 1. Specifically, an ITO application liquid formed by dispersing fine ITO particles in a solvent is prepared. The ITO application liquid is applied onto a substrate. The ITO application liquid on the substrate is heated at from 400 to 800° C. to form an ITO film (transparent electrode).

As described above, the transparent electrode comprising the ITO film is formed by baking at the heating temperature described above. Therefore, it is necessary to prepare the substrate having heat resistance that enables the substrate to endure the baking temperature. The heat resistance of organic functional layers (electricity-generating layers or light-emitting layers) included in organic electronic devices is low. Accordingly, it is impossible to form the transparent electrode comprising the ITO film on such an organic functional layer.

Conductive polymer layers have been developed as transparent electrodes having low baking temperature. Examples of the conductive polymer layers include PEDOT/PSS layers. Such a PEDOT/PSS layer is disclosed in, for example, Document 2. Such a PEDOT/PSS layer is produced by the following method. A dispersion liquid formed by dispersing poly (3,4-ethylenedioxythiophene) (PEDOT) and polystyrene sulfonate (PSS) in water or the like is prepared. The dispersion liquid is applied to a substrate, and the substrate is dried. The PEDOT/PSS layer is formed by the above steps.

Document 3 proposes a transparent conductive film containing metal nanowires, as a transparent electrode substituted for such ITO films and such conductive polymer layers. The transparent conductive film disclosed in Document 3 contains a plurality of metal nanowires, and an ionizing radiation curable resin. The average diameter of the metal nanowires is from 40 to 100 nm, and the metal nanowires are contained in the transparent conductive film. The metal nanowires are, for example, silver. In the transparent conductive film, the metal nanowires intersect each other to form a network structure. As a result, a conductive path is formed, and the conductivity of the transparent conductive film can be obtained. Because the metal nanowires form the network structure, transparency can be obtained. The transparent conductive film of Document 3 is formed by applying a coating containing the metal nanowires onto a substrate or an organic functional layer, and curing the coating by irradiation with light, or drying the coating in a manner similar to that of Document 2.

In addition, transparent electrodes, or members corresponding to transparent electrodes are also disclosed in Documents 4 to 8.

For a solar cell which is one of organic electronic devices, Document 9 discloses that a stainless steel sheet is used as a substrate for a dye-sensitized solar cell. Document 10 discloses a solar cell in which a chromium-containing ferritic steel sheet is used as a substrate, and in which CIGS (compound containing copper (Cu), indium (In), gallium (Ga), and selenium (Se) as main raw materials) which is one of compound semiconductors is used. Document 11 discloses a silicon-based solar cell in which a stainless steel sheet is used as a substrate. Document 12 discloses an organic thin-film solar cell in which a cell structure is formed on a glass substrate using an organic thin film.

Document 1: Japanese Patent Application Laid-Open (JP-A) No. 2009-123396

Document 2: JP-A No. 2013-185137

Document 3: JP-A No. 2012-216535

Document 4: JP-A No. 2012-219333

Document 5: International Publication No. WO 2010/106899

Document 6: Japanese National-Phase Publication (JP-A) No. 2006-527454

Document 7: JP-A No. 2013-152579

Document 8: JP-A No. 2011-86482

Document 9: JP-A No. 2012-201951

Document 10: JP-A No. 2012-97343

Document 11: JP-A No. 2011-204723

Document 12: Organic Electronics, 13 (2012) 2130-2137

SUMMARY OF INVENTION

Technical Problem

The conductive polymer layers need not be baked at high temperature, and are easy to form. Therefore, such a conductive polymer layer can be formed not only on a substrate but also on an organic functional layer. However, the conductivity and light transmissiveness of the conductive polymer layers are lower than those of ITO films.

In the transparent electrode in which the metal nanowires are utilized, the cost of the metal nanowires is high. The gap portions (i.e., resin portions) other than the metal nanowires in the network structure of the metal nanowires have no conductivity, and the conductivity of the transparent electrode is low.

Therefore, for sufficiently exhibiting the function of the organic functional layer of an organic electronic device, further improvement in the conductivity and light transmissiveness of a transparent electrode that can be formed on the organic functional layer is currently demanded.

Thus, an object of the invention is to provide a transparent electrode that can also be formed on an organic functional layer, and has high conductivity and high light transmissiveness, as well as an organic electronic device including the transparent electrode.

Solution to Problem

<1> A transparent electrode, comprising:
   a conductive polymer layer; and
   a plurality of carbon fibers having a diameter larger than a thickness of the conductive polymer layer,
   wherein the carbon fibers are partially embedded in the conductive polymer layer.
<2> The transparent electrode according to claim 1, wherein the diameter of the carbon fibers is from 2 to 90 times the thickness of the conductive polymer layer.
<3> The transparent electrode according to claim 1 or claim 2, wherein the diameter of the carbon fibers is from 2 to 15 μm, and the thickness of the conductive polymer layer is from 5 to 650 nm.
<4> The transparent electrode according to any one of claim 1 to claim 3, wherein lengths of the carbon fibers are from 50 to 7000 μm.
<5> The transparent electrode according to any one of claim 1 to claim 4, wherein an area rate of the carbon fibers, in a case of being viewed from a direction perpendicular to a plane of the transparent electrode, is from 40 to 90% with respect to the transparent electrode.
<6> An organic electronic device, comprising:
   a substrate;
   a substrate electrode that is arranged on the substrate;
   an organic functional layer that is arranged on the substrate electrode; and
   the transparent electrode according to any one of claim 1 to claim 5, the transparent electrode being arranged on the organic functional layer.
<7> The organic electronic device according to claim 6, wherein the substrate is a coated metal substrate or a plastic substrate.
<8> The organic electronic device according to claim 6 or claim 7, wherein the organic functional layer is an organic functional layer comprising an electricity-generating layer as a photoelectric conversion layer.
<9> The organic electronic device according to any one of claim 6 to claim 8, further comprising a sealing layer that seals the substrate electrode, the organic functional layer, and the transparent electrode.

Advantageous Effects of Invention

According to the invention, a transparent electrode that can also be formed on an organic functional layer, and has high conductivity and high light transmissiveness, as well as an organic electronic device including the transparent electrode can be provided.

DESCRIPTION OF EMBODIMENTS

Figure 1:
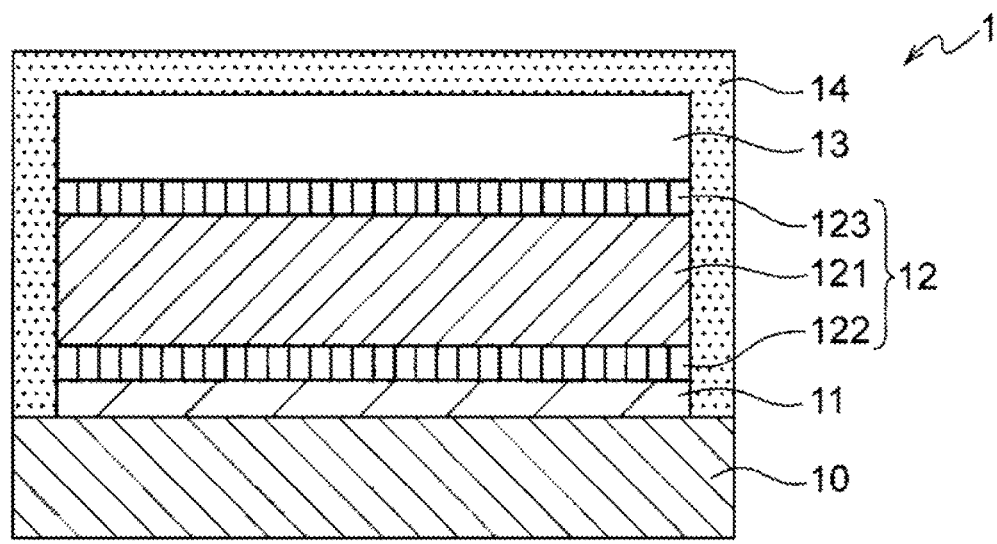
FIG. 1 is a schematic cross-sectional view of an organic electronic device according to an embodiment.

An embodiment which is an example of the invention will be described in detail below with reference to the drawings. Components that are the same as or equivalent to each other in the drawings may be denoted by the same reference characters, and the descriptions thereof may be omitted.

<Organic Electronic Device>

As illustrated in FIG. 1, an organic electronic device 1 according to the embodiment includes a substrate 10, a substrate electrode 11 that is arranged on the substrate 10, an organic functional layer 12 that is arranged on the substrate electrode 11, and a transparent electrode 13 that is arranged on the organic functional layer 12. The organic electronic device 1 also includes a sealing layer 14 that seals the substrate electrode 11, the organic functional layer 12, and the transparent electrode 13. The sealing layer 14 is a layer that is disposed, if necessary.

Figure 2:
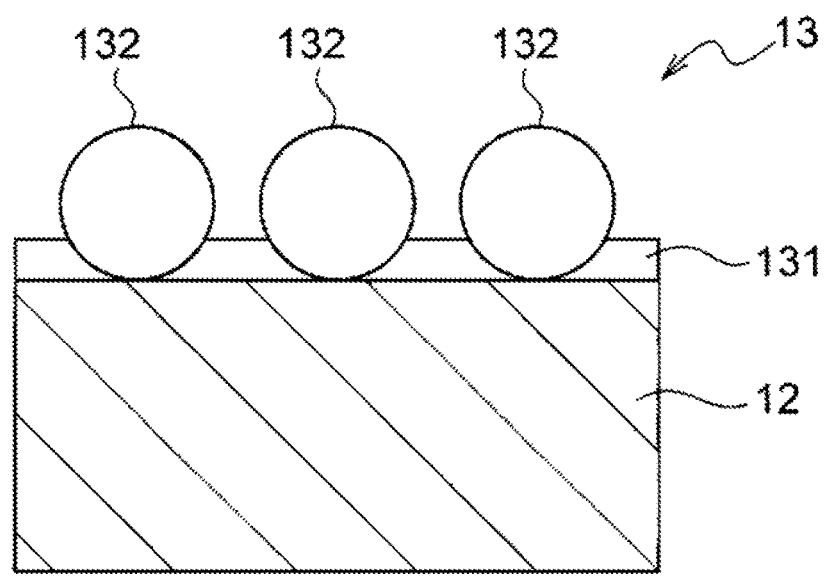
FIG. 2 is a schematic cross-sectional view of a transparent electrode according to the embodiment.
Figure 3:
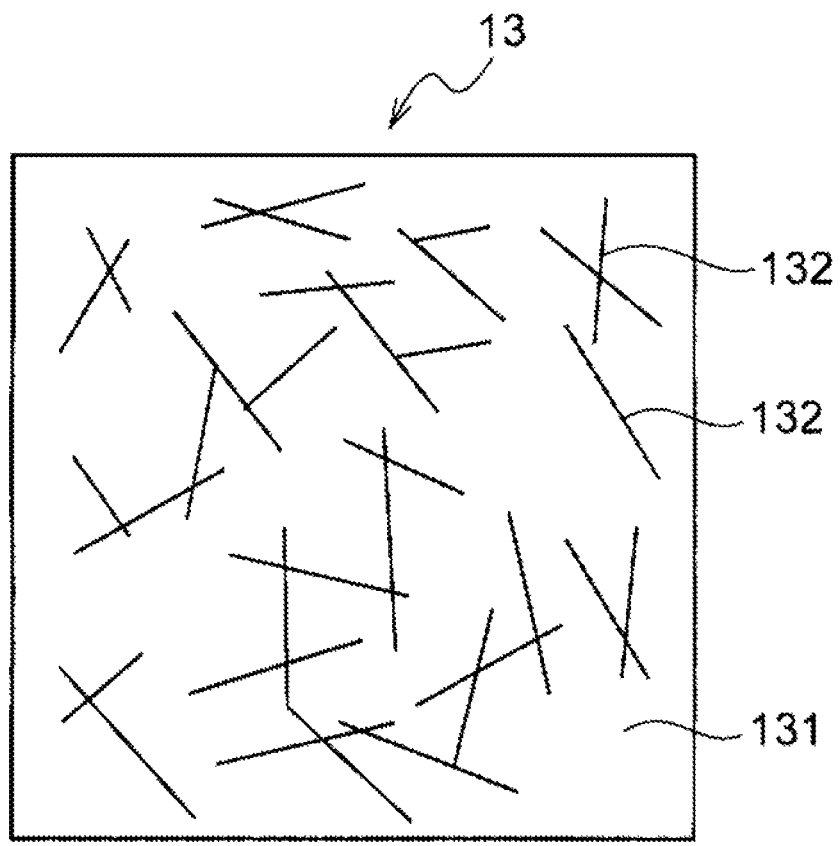
FIG. 3 is a schematic plan view of the transparent electrode according to the embodiment.

The transparent electrode 13 that is disposed as an upper electrode of the organic electronic device 1 includes a conductive polymer layer 131, and a plurality of carbon fibers 132 having a diameter larger than the thickness of the conductive polymer layer 131, and the carbon fibers 132 are partially embedded in the conductive polymer layer 131, as illustrated in FIG. 2 to FIG. 3. "Carbon fibers 132 are partially embedded in conductive polymer layer 131" means that a part of each fiber of the plurality of carbon fibers is embedded in the conductive polymer layer 131.

The above-described configuration allows the organic electronic device 1 according to the embodiment to become a device that sufficiently exhibits the function of the organic functional layer 12. The reason for this is supposed as follows.

The transparent electrode 13 includes the plurality of carbon fibers 132 having high conductivity. The carbon fibers 132 are in the state of being exposed from the conductive polymer layer 131 because the carbon fibers 132 have a diameter larger than the thickness of the conductive polymer layer 131. The carbon fibers 132 are disposed to be partially embedded in the conductive polymer layer 131. Therefore, the carbon fibers 132 and a layer with which the conductive polymer layer 131 comes in contact (the organic functional layer 12 in the embodiment) come in contact with each other, or the distances between the carbon fibers 132 and the lower layer with which the conductive polymer layer comes in contact are short. Thus, the state of facilitating direct conduction between the carbon fibers 132 and the lower layer is achieved. The carbon fibers 132 are allowed to have a diameter larger than the thickness of the conductive polymer, thereby facilitating a state in which the plurality of carbon fibers 132 come in contact with each other. In addition, the gap portions other than the carbon fibers 132 are in the state of being imparted with conductivity by the conductive polymer layer 131. As a result of the above, the conductivity of the transparent electrode 13 is improved.

The light transmissiveness of the transparent electrode 13 is improved because the conductive polymer layer 131 having low light transmissiveness is disposed to have a larger thickness than the diameter of the carbon fibers 132. The conductivity of the transparent electrode 13 is improved by the carbon fibers 132 having high conductivity even in a case in which the thickness of the conductive polymer layer 131 is reduced.

The transparent electrode 13 including the carbon fibers 132 and the conductive polymer layer 131 can be formed at low temperature by, for example, application, drying, and the like of an application liquid containing the carbon fibers 132 and a conductive polymer. In other words, the transparent electrode 13 can also be formed on the organic functional layer 12.

Therefore, the transparent electrode 13 can also be formed on the organic functional layer 12, and is presumed to have enhanced conductivity and light transmissiveness. The organic electronic device 1 including the transparent electrode 13 is a device that sufficiently exhibits the function of the organic functional layer 12.

Each component of the organic electronic device 1 will be described in detail below.

[Substrate 10]

The material of the substrate 10 is not particularly restricted. The substrate 10 may contain a resin, or may contain an inorganic material of which typical examples include glass. The substrate 10 may have light transmissiveness, or does not necessarily have light transmissiveness.

Specifically, the substrate 10 may be an inorganic substrate including an inorganic material such as, for example, glass, ceramic, or a metal, or may be a plastic substrate including a resin such as an acrylic resin, a polycarbonate resin, a polyolefin resin, a polyester resin, an epoxy resin, a urethane resin, a polyvinyl alcohol resin, a polyvinyl chloride resin, a polyethylene resin, or a polyimide resin. For example, a surface of the substrate 10 may be coated with an insulating layer, and the substrate electrode 11 may be formed on the insulating layer in order to electrically insulate the substrate 10 from the substrate electrode 11 in a case in which the substrate 10 is a conductor such as a metal substrate. Examples of the metal sheet include a coated metal sheet.

[Substrate Electrode 11]

The substrate electrode 11 is arranged on the substrate 10. The substrate electrode 11 has a well-known configuration. The substrate electrode 11 is, for example, a metallic thin film. The metallic thin film is, for example, a thin film including a metal such as aluminum, silver, or gold, or an alloy of aluminum, silver, gold, or the like. The substrate electrode 11 may be a thin film including metal nanowires, tin-doped indium tin oxide (ITO), fluorine-doped tin oxide (FTO), aluminum-doped zinc oxide (ZAO), graphene, a conductive polymer, or the like.

In a case in which the substrate electrode 11 is a thin film including a conductive polymer, the substrate electrode 11 can be produced by a method that enables the film to be formed at low temperature (for example, a spin coating method) rather than by a costly method such as vapor deposition.

The thickness of the substrate electrode 11 is not particularly restricted, and is preferably from 0.5 to 3 μm, and more preferably from 1 to 2 μm, in consideration of performance and a cost.

[Organic Functional Layer 12]

The organic functional layer 12 is arranged on the substrate electrode 11. The organic functional layer 12 is arranged between the substrate electrode 11 and the transparent electrode 13. Examples of the organic functional layer 12 include an organic functional layer including a photoelectric conversion layer (an electricity-generating layer, a light-emitting layer, a light-receiving layer, or the like) in a case in which the organic electronic device 1 is a photoelectric conversion element. The organic functional layer 12 may include a plurality of layers. In a case in which the organic functional layer 12 includes the plurality of layers, the organic functional layer 12 means a layer in which at least one layer includes an organic layer.

Specifically, the organic functional layer 12 includes, for example, a photoelectric conversion layer 121, an electron transport layer 122 disposed on a side, closer to the substrate electrode 11, of the photoelectric conversion layer 121, and a hole transport layer 123 disposed on a side, closer to the transparent electrode 13, of the photoelectric conversion layer 121. For example, the photoelectric conversion layer 121 is an electricity-generating layer in a case in which the organic electronic device 1 is a solar cell, the photoelectric conversion layer 121 is a light-emitting layer in a case in which the organic electronic device 1 is a light-emitting element, and the photoelectric conversion layer 121 is a light-receiving layer in a case in which the organic electronic device 1 is an imaging element.

The organic functional layer 12 may have a configuration including only a light conversion layer 12A, or may have a configuration including the light conversion layer 12A and either the electron transport layer 122 or the hole transport layer 123. In addition, the organic functional layer 12 may have a configuration including a layer other than the above, for example, a hole injection layer, an electron injection layer, an insulating layer, an antireflection layer, or the like.

[Transparent Electrode 13]

The transparent electrode 13 is arranged as an upper electrode on the organic functional layer 12. The transparent electrode 13 includes the conductive polymer layer 131 and the plurality of carbon fibers 132.

(Conductive Polymer Layer 131)

The conductive polymer layer 131 contains a conductive polymer. The conductive polymer is a polymer through which electricity can flow. Preferred examples of the conductive polymer include a non-conjugated or conjugated polymer in which an aromatic carbocycle, an aromatic heterocycle, or a heterocyclic ring is linked through a single bond or a divalent or higher-valent linking group.

Examples of the conductive polymer include one or more substituted or unsubstituted conductive polymers selected from the group consisting of polyaniline, polythiophene, polyparaphenylene, polyisothianaphtene, polyparaphenylene vinylene, polyfuran, polypyrrole, polyselenophene, polyphenylene sulfide, polyacetylene, polypyridylvinylene, polyethylenedioxythiophene, poly(p-phenylene), and polyazine.

It is preferable to add, as dopants, for example, one or two selected from the group consisting of halogens, alkali metals, amino acids, alcohols, camphorsulfonic acid, dodecylbenzenesulfonic acid, poly(styrenesulfonic acid), and poly(vinylsulfonic acid) to the conductive polymer that is a conjugated polymer because convenience is enhanced. Specifically, the addition of such dopants to such conductive polymers that are such conjugated polymers results in stabilization of a state, improvement in solubility, and improvement in conductivity.

The conductive polymer preferably has hydrophilicity. In this case, the conductive polymer layer 131 can be formed using a water-based dispersion liquid of the conductive polymer.

Still more preferably, the conductive polymer is PEDOT/PSS. PEDOT/PSS is a polymer compound composed of poly(3,4-ethylenedioxythiophene) (PEDOT) and poly(styrenesulfonic acid) (PSS).

Known PEDOT/PSS may be used. Examples of commercially available PEDOT/PSS include CLEVIOS SERIES from H. C. Starck GmbH, PEDOT-PSS 483095 and 560598 from Aldrich Corporation, and DENATRON SERIES from Nagase Chemtex Corporation.

The preferred thickness of the conductive polymer layer 131 is from 5 to 650 nm. In a case in which the thickness of the conductive polymer layer 131 is excessively small, the conductivity (current collection efficiency) of the transparent electrode 13 may be deteriorated. In contrast, in a case in which the conductive polymer layer 131 is excessively thick, the light transmissiveness of the transparent electrode 13 may be deteriorated. Accordingly, in a case in which the thickness of the conductive polymer layer 131 is from 5 to 650 nm, the conductivity (current collection efficiency) and light transmissiveness of the transparent electrode 13 can be easily enhanced. The lower limit of the conductive polymer layer 131 is preferably 100 nm, and still more preferably 130 nm. The upper limit of the conductive polymer layer 131 is preferably 600 nm, and still more preferably 400 nm.

The thickness of the conductive polymer layer 131 is a value measured by the following method. A cross section of the transparent electrode 13 is observed at a 20-fold magnification with a scanning electron microscope (SEM), and the thickness of the conductive polymer layer 131 located at a center between the carbon fibers 132 is measured. Such measurement is performed at five places, and the average value of values obtained by the measurement is regarded as the thickness of the conductive polymer layer 131.

The reason that targets for the measurement of the thickness of the conductive polymer layer 131 are the centers between the carbon fibers 132 is because the conductive polymer layer 131 is formed to be bowed outward in regions near to the carbon fibers 132 due to surface tension.

(Carbon Fibers 132)

The carbon fibers 132 are well-known carbon fibers. The carbon fibers 132 are produced, for example, by flameproofing or carbonizing acrylic fibers, or by performing infusible treatment, carbonization, or graphitization from petroleum pitch.

The diameter of the carbon fibers 132 is larger than the thickness of the conductive polymer layer 131. Therefore, the carbon fibers 132 are partially embedded in the conductive polymer layer 131, as illustrated in FIG. 2. In other words, a part of each carbon fiber 132 is included in the conductive polymer layer 131 while the remainder of each carbon fiber 132 is exposed from the conductive polymer layer 131. Specifically, for example, the plurality of carbon fibers 132 are dotted and arranged so that one radial part of each of the carbon fibers 132 (for example, a part, which is one radial part of each of the carbon fibers 132, of a region from the outer peripheral surface thereof to one-third (preferably to one-fourth or less) of the diameter thereof) is embedded in the conductive polymer layer 131.

The carbon fibers 132 may be arranged on the conductive polymer layer 131 so that one carbon fiber 132 overlaps with another carbon fiber 132. In this case, for example, a part of the one carbon fiber 132, excluding a region in which the one carbon fiber 132 overlaps with the other carbon fiber 132, and the neighborhood of the region, is in the state of being embedded in the conductive polymer layer 131.

The preferred diameter of the carbon fibers 132 is from 2 to 90 times the thickness of the conductive polymer layer 131. In a case in which the ratio of the diameter of the carbon fibers 132 to the thickness of the conductive polymer layer 131 is excessively low, the conductivity of the transparent electrode 13 may be deteriorated. In a case in which the ratio of the diameter of the carbon fibers 132 to the thickness of the conductive polymer layer 131 is excessively high, the light transmissiveness of the transparent electrode 13 may be deteriorated. Accordingly, the conductivity (current collection efficiency) and light transmissiveness of the transparent electrode 13 can be easily enhanced in a case in which the ratio of the diameter of the carbon fibers 132 to the thickness of the conductive polymer layer 131 is from 2 to 90 times. The lower limit of the ratio of the diameter of the carbon fibers 132 to the thickness of the conductive polymer layer 131 is more preferably 18 times, and still more preferably 35 times. The upper limit of the ratio of the diameter of the carbon fibers 132 to the thickness of the conductive polymer layer 131 is more preferably 84 times, and still more preferably 60 times.

Specifically, the preferred diameter of the carbon fibers 132 is from 2 to 15 µm. The lower limit of the diameter of the carbon fibers 132 is more preferably 5 µm, and still more preferably 8 µm. The upper limit of the diameter of the carbon fibers 132 is more preferably 13 µm, and still more preferably 11 µm.

The diameter of the carbon fibers 132 is a value measured by the following method. A cross section of the transparent electrode 13 is observed at a 5000-fold magnification with a scanning electron microscope (SEM), and the diameters of cross sections perpendicular to the lengthwise directions of the carbon fibers 132, among the cross sections of the carbon fibers 132, are measured. Such measurement is performed at five places, and the average value of values obtained by the measurement is regarded as the diameter of the carbon fibers 132.

In a case in which the carbon fibers 132 can be separately collected, the carbon fibers 132 are directly observed and measured.

The preferred length of the carbon fibers 132 is from 50 to 7000 µm (7 mm). It is preferable that at least some of the plurality of carbon fibers 132 come in contact with each other in the transparent electrode 13, as illustrated in FIG. 3. In this case, the conductivity of the transparent electrode 13 can be easily enhanced. In a case in which the length of the carbon fibers 132 is excessively short, the number of carbon fibers 132 coming in contact with each other may decrease, thereby deteriorating the conductivity of the transparent electrode 13. In contrast, in a case in which the length of the carbon fibers 132 is excessively long, homogeneous dispersion of the carbon fibers 132 in the transparent electrode 13 may be precluded, thereby deteriorating the conductivity. Accordingly, the conductivity of the transparent electrode 13 can be easily enhanced in a case in which the length of the carbon fibers 132 is from 50 to 7000 µm. The lower limit of the length of the carbon fibers 132 is more preferably 2000 µm, and still more preferably 2500 µm. The upper limit of the length of the carbon fibers 132 is more preferably 6500 µm, and still more preferably 6000 µm.

The length of the carbon fibers 132 is a value measured by the following method. A plane of the transparent electrode 13 (a plane closer to a region in which the carbon fibers 132 are disposed) is observed at a 10-fold magnification with an optical microscope, and the lengths of the carbon fibers 132 are measured. Such measurement is performed at five places, and the average value of values obtained by the measurement is regarded as the length of the carbon fibers 132.

In a case in which the carbon fibers 132 can be separately collected, the carbon fibers 132 are directly observed and measured.

The preferred area rate of the carbon fibers 132 is from 40 to 90% with respect to the transparent electrode 13. The area rate of the carbon fibers 132 is the percentage of the area of the carbon fibers occupying the unit area of the transparent electrode 13 (the projection area of the carbon fibers in the thickness direction of the transparent electrode 13) in the case of being viewed from a direction perpendicular to the plane of the transparent electrode 13 (the plane closer to the region in which the carbon fibers 132 are disposed). In a case in which the area rate of the carbon fibers 132 is excessively low, the conductivity of the transparent electrode 13 may be deteriorated. In a case in which the area rate of the carbon fibers 132 is excessively high, the light transmissiveness of the transparent electrode 13 may be deteriorated. Accordingly, the conductivity and light transmissiveness of the transparent electrode 13 can be easily enhanced in a case in which the area rate of the carbon fibers 132 is from 40 to 90%. The lower limit of the area rate of the carbon fibers 132 is more preferably 45%, and still more preferably 50%. The upper limit of the area rate of the carbon fibers 132 is more preferably 87%, and still more preferably 80%.

The area rate of the carbon fibers 132 is a value measured by the following method. A plane of the transparent electrode 13 (a plane closer to a region in which the carbon fibers 132 are disposed) is observed at a 5-fold magnification with an optical microscope, and the area rate of the carbon fibers 132 in the observed visual field is measured. Such measurement is performed at five visual fields, and the average value of values obtained by the measurement is regarded as the area rate of the carbon fibers 132.

The preferred content of the carbon fibers 132 in the transparent electrode 13 is from 70 to 98 mass %. In a case in which the content of the carbon fibers 132 is excessively low, the conductivity of the transparent electrode 13 may be deteriorated. In contrast, in a case in which the content of the carbon fibers 132 is excessively high, the light transmissiveness of the transparent electrode 13 may be deteriorated. Accordingly, the conductivity and light transmissiveness of the transparent electrode 13 can be easily enhanced in a case in which the content of the carbon fibers 132 is from 70 to 98 mass %.

[Sealing Layer 14]

The sealing layer 14 is a layer that is disposed on the transparent electrode 13, and seals the substrate electrode 11, the organic functional layer 12, and the transparent electrode 13. The sealing layer 14 is not particularly restricted, and a sealing layer including a well-known sealing material having high light transmissiveness as well as having durability (weather resistance, high-temperature resistance, high-humidity resistance, or the like) and electrical insulation properties is used as the sealing layer 14.

Examples of the sealing material include resin sealing materials such as ethylene-vinyl acetate copolymer (EVA), polyethylene terephthalate, polyethylene naphthalate, polyethersulfone, and polycarbonate.

[Production Method]

An example of a method of producing the organic electronic device 1 and the transparent electrode 13 will be described.

The substrate 10, the substrate electrode 11, and the organic functional layer 12 are produced by a well-known method. For example, first, the substrate 10 is prepared. The substrate electrode 11 is formed on the substrate 10. The substrate electrode 11 is produced by a well-known method. In a case in which the substrate electrode 11 is a metallic thin film, the substrate electrode 11 is formed by a method such as a vapor deposition method or a sputtering method using an electrode material (metal or the like). In a case in which the substrate electrode 11 is an ITO film, an ITO application liquid is applied onto the substrate. The ITO application liquid on the substrate is heated at from 400 to 800° C. to form the substrate electrode 11 (ITO film).

After the formation of the substrate electrode 11, the organic functional layer 12 is formed. The organic functional layer 12 is produced by a well-known method. The organic functional layer 12 is produced by, for example, a casting method, a spin coating method, a doctor blade method, a screen printing method, an ink-jet method, a meniscus method, a die coating method, a gravure printing method, a slide coating method, a spray method, a flexographic printing method, an electrophotographic method, a vapor deposition method, or the like.

After the formation of the organic functional layer 12, the transparent electrode 13 is formed on the organic functional layer 12. For example, first, a conductive polymer dispersed liquid is produced. Specifically, a conductive polymer is dispersed in a solvent by a known method. Examples of the known method include ultracentrifugal grinding methods, cutting mill methods, disc mill methods, and ball mill methods. Examples of the solvent include water, alcohols, and ethers. Preferably, the solvent is water.

The carbon fibers 132 are added to the conductive polymer dispersed liquid, and the carbon fibers 132 are dispersed in the conductive polymer dispersed liquid. The known method described above is adopted as a dispersion method. The conductive polymer dispersed liquid is produced by the above steps.

An additive may be added to the conductive polymer dispersed liquid. Examples of the additive include surfactants, dissolution accelerators, plasticizers, antioxidants, sulfurization inhibitors, and viscosity modifiers.

Examples of the surfactants include anionic surfactants such as alkyl sulfonic acids, alkylbenzene sulfonic acids, and alkylcarboxylic acids; cationic surfactants such as primary to tertiary fatty amines, quaternary ammonium, and tetraalkylammoniums; zwitterionic surfactants such as N,N-dimethyl-N-alkyl-N-carboxymethyl ammonium betaine and N,N,N-trialkyl-N-sulfoalkylene ammonium betaine; and nonionic surfactants such as polyoxyethylene alkyl ethers, polyoxyethylene alkyl phenyl ethers, and polyoxyethylene polystyryl phenyl ethers.

Preferably, dimethylsulfoxide (DMSO) is further added as an additive in the case of using PEDOT/PSS as the conductive polymer. DMSO further enhances the conductivity of PEDOT/PSS.

The conductive polymer dispersed liquid is prepared by the above steps.

In a case in which the content of the carbon fibers in the conductive polymer dispersed liquid is high, the light transmissiveness of the transparent electrode 13 may be deteriorated. Accordingly, the preferred content of the carbon fibers is 2.5 mass % or less. In contrast, in a case in which the content of the carbon fibers in the conductive polymer dispersed liquid is excessively low, the conductivity of the transparent electrode 13 may be deteriorated. Accordingly, the lower limit of the content of the carbon fibers in the conductive polymer dispersed liquid is preferably 1.0 mass %, and still more preferably 1.5 mass %.

In the case of adding a surfactant to the conductive polymer dispersed liquid, the excessively high content of the surfactant in the conductive polymer dispersed liquid may result in deterioration of the conductivity of the transparent electrode 13. Accordingly, the preferred content of the surfactant is 2.5 mass % or less. The preferred lower limit of the content of the surfactant is 0.1 mass %.

In the case of adding DMSO to the conductive polymer dispersed liquid, the excessively high content of DMSO in the conductive polymer dispersed liquid results in saturation of the effect of improvement in conductivity. Accordingly, the preferred content of DMSO is 15 mass % or less. The preferred lower limit of the content of DMSO is 5 mass %.

Then, the prepared conductive polymer dispersed liquid is applied onto the organic functional layer 12. Specifically, the conductive polymer dispersed liquid is applied onto the organic functional layer 12 using, for example, spin coating, casting, an extrusion die coater, a bread coater, an air doctor coater, a knife coater, an applicator, or the like. As a result, a coating film of the conductive polymer dispersed liquid is produced. In the case of producing the film using the applicator, the preferred thickness of the coating film of the dispersion liquid is from 0.5 MIL to 7 MIL (1 MIL=12.5 μm).

After the production of the film, the coating film of the dispersion liquid is dried to form the transparent electrode 13. A drying method is not particularly limited. For example, the drying is performed at a temperature of 120° C. or less for a predetermined time. The preferred drying time is from 20 seconds to 30 minutes. However, the drying time is not limited thereto. For example, a hot plate, an oven, a hot-blast stove, or the like can be used in the drying step.

Then, the sealing layer 14 is formed on the transparent electrode 13 utilizing a well-known method, to seal the substrate electrode 11, the organic functional layer 12, and the transparent electrode 13.

The organic electronic device 1 and the transparent electrode 13 are produced by the above production steps. The transparent electrode 13 can be easily produced by applying and drying the dispersion liquid. Because the transparent electrode 13 is formed by the drying, it is not necessary to heat the coating film of the dispersion liquid to a high temperature of 400° C. or more as in the case of the ITO film. Therefore, the transparent electrode 13 can be easily produced even on the organic functional layer 12 having poor heat resistance.

The embodiment in which the transparent electrode 13 is formed by the above-described production method using the conductive polymer dispersed liquid to which the carbon fibers 132 are added is described. However, a method of forming the transparent electrode 13 is not limited thereto. For example, the transparent electrode 13 may be formed by applying a conductive polymer dispersed liquid that does not contain any carbon fiber 132 onto the organic functional layer 12 to form a film, then sprinkling the carbon fibers 132 on the coating film of the conductive polymer dispersed liquid, and drying the film.

It is preferable to apply a conductive polymer dispersed liquid mixed with the carbon fibers 132 onto the organic functional layer 12 to form the transparent electrode 13. In this case, the conductive polymer easily enters portions between the carbon fibers 132 even in a case in which the carbon fibers 132 are arranged, thereby vertically overlapping each other. Therefore, the conductivity of the transparent electrode 13 can be easily enhanced.

The transparent electrode 13 may be formed on the substrate 10 rather than on the organic functional layer 12. Even in the case of forming the transparent electrode 13 on the substrate 10, a method of producing the transparent electrode 13 is the same as the above-described method.

Examples of the organic electronic device 1 include solar cells, light-emitting elements (organic electroluminescence elements and the like), imaging elements (image sensors and the like), transistors, and displays. The transparent electrode 13 can be utilized not only as such organic electronic devices 1 but also as a transparent electrode in an inorganic electronic device having an inorganic functional layer.

<Solar Cell Module>

Figure 4:
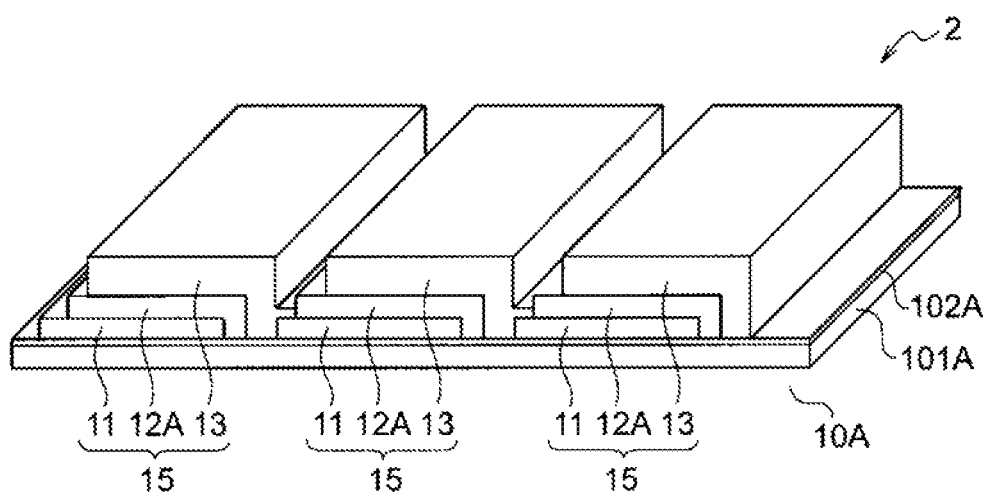
FIG. 4 is a schematic view illustrating the configuration of a solar cell module according to the embodiment.

A solar cell module 2 according to the embodiment includes a coated metal substrate 10A, and a plurality of cell structures (single cells) 15 arranged on the coated metal substrate, as illustrated in FIG. 4. The solar cell module 2 also includes a sealing layer which is not illustrated, and seals the cell structures (single cells) 15. Each cell structure 15 includes a substrate electrode 11, an electricity generation unit 12A that is arranged on the substrate electrode 11, and a transparent electrode 13 that is arranged on the electricity generation unit 12A. In each cell structure (single cell) 15, a portion in which all of the substrate electrode, the electricity generation unit, and the transparent electrode overlap each other is an electricity generation place (electricity generation region).

In the solar cell module 2, the transparent electrode 13 of one cell structure 15 adjacent to another cell structure 15 is connected to the substrate electrode 11 of the other cell structure 15, whereby connections between the plurality of cell structures 15 are formed to modularize the cell structures 15. The connections (wiring) between the plurality of cell structures 15 are formed, for example, by allowing the substrate electrodes 11 and transparent electrodes 13 of the cell structures 15 adjacent to each other to overlap each other.

In general, for example, the voltages of cell structures (single cells) used in solar cells are around 1 V. However, for example, the voltages of cell structures (single cells) including organic thin films used in organic thin-film solar cells (OPV) are 1 V or less. Therefore, connection between a plurality of cell structures (single cells) and an increase in final output voltage are required for achieving practical utilization of an organic thin-film solar cell. In order to increase the final output voltage, the plurality of cell structures (single cells) are connected, thereby obtaining a module. In general, the power conversion efficiency of a solar cell module is calculated and evaluated by dividing an electric-generating capacity by a total area irradiated with light, and therefore, a smaller connection (wiring) area is preferable. Thus, the wiring area can be reduced in a case in which a plurality of cell structures (single cells) can be produced on the same substrate. Therefore, it is effective to modularize organic thin-film solar cells.

The solar cell module 2 is an example of a device obtained by modularizing the organic electronic device 1 in which the coated metal substrate 10A is used as the substrate, and the electricity generation unit 12A is used as the organic functional layer 12. In other words, the organic electronic device 1 may be a device obtained by arranging a plurality of structures including the substrate electrode 11, the organic functional layer 12, and the transparent electrode 13 on the substrate 10, and by modularizing the structures.

The details of each component of the solar cell module 2 will be described below.

[Coated Metal Substrate 10A]

The coated metal substrate 10A includes, for example, a base metal sheet 101A such as a steel sheet, and a coated layer 102A formed by applying a coating to a surface of the base metal sheet 101A. FIG. 4 illustrates an example in which the coated layer 102A is disposed only on one surface of the base metal sheet 101A. However, coated layers 102A may be disposed on both surfaces of the base metal sheet 101A. In the case of disposing the coated layer 102A only on one surface of the base metal sheet 101A, the cell structures 15 are formed on the surface of the coated metal substrate 10A, on which the coated layer 102A is disposed.

In the case of using a metal sheet having conductivity as the substrate, avoidance of direct contact of the substrate electrode with the substrate having conductivity is required for configuring a module by the plurality of cell structures (single cells) 15 formed on the substrate. The use of the coated metal substrate 10A including the coated layer 102A having an insulating property on a side facing the substrate electrode 11 makes it possible to easily obtain the solar cell module 2 in which the plurality of cell structures 15 are disposed on one coated metal substrate 10A.

The coated metal substrate 10A is preferably a coated metal substrate which includes the coated layer 102A including one or more coating films on one surface or both surfaces of the base metal sheet 101A, and in which a value of the arithmetic mean roughness Ra of a surface of the coated layer 102A is 20 nm or less, the minimum value of a dynamic storage elastic modulus in the rubber-like elastic region of an outermost layer of the coated layer 102A is $2 \times 10^9$ Pa or less, the total film thickness of the coated layer 102A is from 1 to 30 µm, and a leakage current value during application of a voltage of 100 V is less than $10^{-6}$ A/cm$^2$.

In a case in which the coated layer 102A includes one coating film, the outermost layer of the coated layer 102A corresponds to the coating film. In a case in which the coated layer 102A includes two or more coating films, the outermost layer of the coated layer 102A corresponds to a coating film located on an outermost surface of the coated layer 102A.

In a case in which the coated layer 102A includes two or more coating films, the physical properties of the coating film of the outermost layer influence the properties of the coated metal substrate 10A and the solar cell module including the coated metal substrate 10A, as described below. Thus, the coated layer 102A is specified primarily in relation to the coating film of the outermost layer.

A surface of the coated layer 102A preferably has an arithmetic mean roughness Ra value of 20 nm or less, and more preferably has an arithmetic mean roughness Ra value of 20 nm or less, and a total roughness Rz value of a maximum peak height Rp and a maximum valley depth Rv, of 200 nm or less. In a case in which the outermost layer has a Ra of 20 nm or more, it may be difficult to sufficiently flatten the concavities and convexities of a surface of the coated metal substrate, thereby deteriorating electrical performance. In a case in which the coating film of the outermost layer has an Rz value of more than 200 nm, pinholes may be generated in the substrate electrode 11 formed on the coated metal substrate 10A, thereby causing a short circuit, even in the case of an Ra of 20 nm or less.

A numerical value of the surface roughness of the coated layer 102A is known to vary according to a measurement method. Therefore, the arithmetic mean roughness Ra, and the total roughness Rz of a maximum peak height Rp and a maximum valley depth Rv are defined as values calculated based on a roughness curve measured from an image obtained by imaging the surface geometry of the coated layer 102A using an atomic force microscope (AFM).

The total film thickness of the coated layer 102A is preferably from 1 to 30 µm, and more preferably from 5 to 20 µm. The insulating property of the coated layer 102A may be deteriorated in a case in which the total film thickness is less than 1 µm. A disadvantage may occur in view of a cost in a case in which the total film thickness is more than 20 µm.

The total film thickness of the coated layer 102A is a value measured by observing a cross section of the coated layer 102A. Specifically, the coated metal substrate 10A is embedded in an ordinary temperature drying type epoxy resin perpendicularly to the thickness direction of the coated layer 102A, and a surface in which the coated metal substrate 10A is embedded is mechanically polished. The polished surface is observed at a magnification of 5000 with a scanning electron microscope (SEM), and the coated layer 102A is measured. Such measurement is performed at five places, and the average value of values obtained by the measurement is regarded as the total film thickness of the coated layer 102A.

It is preferable that the coated layer 102A has the function of reducing thermal stress generated due to a difference between the coefficients of thermal expansion of both of the coated metal substrate 10A and each cell structure 15 formed on the coated metal substrate 10A (particularly, each substrate electrode 11 coming in contact with the coated metal substrate 10A, in the cell structures 15). In other words, it is preferable that the coated layer 102A allows interface stress between each substrate electrode 11 and the coated metal substrate 10A to be reduced, thereby reducing strain energy accumulated in a case in which a heat history is given to the formed cell structures 15.

In the solar cell module in which the cell structures 15 can be produced at low temperature, it is preferable that the coated layer 102A has the above-described function in order to obtain the higher reliability of the solar cell module although the generation of thermal stress is precluded due to the difference between both the coefficients of thermal expansion.

Such strain energy is commonly accumulated in the coated layer 102A, and can be reduced by the viscoelastic properties of a primary resin included in the coated layer 102A. In the coated layer 102A, the primary resin is not particularly limited. For example, in a case in which the primary resin is a thermosetting resin having a cross-linked structure, the strain energy depends on a molecular weight between cross-links, and the molecular weight between cross-links commonly correlates with the equilibrium elasticity modulus of the rubber-like elastic region of the resin.

A resin that is a viscoelastic body has an elasticity modulus varying depending on a temperature and a time (a frequency in the case of a dynamic storage elastic modulus). A cross-linked thermosetting resin indicates a high elasticity modulus (commonly a value of from around $10^9$ to $10^{10}$ Pa) in a low-temperature or short-time (high-frequency in the case of a dynamic storage elastic modulus) region (the region is commonly referred to as a glass-like elastic region). A region in which an elasticity modulus sharply decreases according to higher temperature or a longer time (a lower frequency in the case of a dynamic storage elastic modulus) appears (the region is commonly referred to as a transition region). In addition, the equilibrium elasticity modulus becomes constant at high temperature or a long time (low frequency in the case of a dynamic storage elastic modulus), and the equilibrium elastic region in this case is referred to as a rubber-like elastic region (commonly indicating a value of from around $10^6$ to $10^8$ Pa).

The property of the coating film is defined by the minimum value of dynamic storage elastic modulus appearing in a high-temperature rubber-like elastic region, in dynamic storage elastic modulus measured in a region at a constant frequency (angular frequency of 6.28 rad/sec) and a temperature of from −50 to 200° C. by a dynamic viscoelasticity measuring apparatus. A dynamic storage elastic modulus is commonly represented by E', and defined by $E'=(\sigma 0/\gamma 0) \cos \delta$. Herein, $\sigma 0$ represents the maximum amplitude of stress, γ0 represents the maximum amplitude of strain, and δ represents a phase angle between the stress and the strain.

The minimum value of dynamic storage elastic modulus in the rubber-like elastic region of the outermost layer of the coated layer 102A is preferably $2 \times 10^9$ Pa or less, and more preferably $2 \times 10^7$ Pa or less. This is because the molecular weight between cross-links of the primary resin of the outermost layer of the coated layer 102A may become small, and elastic strain energy accumulated in the coated layer 102A (outermost layer thereof) in a case in which the coated layer 102A receives thermal stress may become large, in a case in which the minimum value of the dynamic storage elastic modulus is more than $2 \times 10^9$ Pa. In other words, this is because even in a case in which the appearance of the coated layer 102A is unproblematical immediately after the formation of the cell structures 15, the coated layer 102A (outermost layer thereof) may be broken or peeled in a case in which the coated layer 102A receives a heat history.

It is preferable that the coated metal substrate 10A has a leakage current value of less than $10^{-6}$ A/cm$^2$ in the case of applying a voltage of 100 V. It is necessary that the coated metal substrate 10A has insulating properties for inhibiting deterioration of electrical performance due to conduction between the electricity generation unit 12A including an electricity-generating layer and the like as a photoelectric conversion layer 121, and the base metal sheet 101A. It may be difficult to secure the quality of the electricity generation unit 12A in a case in which the leakage current value is $10^{-6}$ A/cm$^2$ or more.

The primary resin of the coated layer 102A is not particularly limited, and examples thereof include polyester resin, epoxy resin, urethane resin, acrylic resin, melamine resin, and fluorine resin. The primary resin of the coated layer 102A is preferably a thermosetting resin in a case in which the primary resin is used in applications in which severe processing is performed. Examples of the thermosetting resin include polyester resins (epoxy polyester resin, polyester resin, melamine polyester resin, urethane polyester resin, and the like), and acrylic resins. The polyester resins and the acrylic resins are superior in processability to other resins, and inhibit the coated layer 102A from being cracked even after severe processing.

The primary resin of the outermost layer of the coated layer 102A is not particularly limited, and is preferably a polyester resin. The polyester resin is not particularly limited, and is preferably a commonly known ester compound of a polybasic acid and a polyhydric alcohol, which compound is synthesized by a commonly known esterification reaction.

The polybasic acid is not particularly limited, and examples thereof include phthalic acid, isophthalic acid, terephthalic acid, phthalic anhydride, trimellitic anhydride, maleic acid, adipic acid, and fumaric acid. These polybasic acids may be used singly, or in combination of plural kinds thereof The polyhydric alcohol is not particularly limited, and examples thereof include ethylene glycol, diethylene glycol, polyethylene glycol, propylene glycol, dipropylene glycol, polypropylene glycol, neopentylene glycol, 1,4-butanediol, 1,5-pentanediol, 1,6-hexanediol, 1,4-cyclohexanedimethanol, polytetramethylene ether glycol, glycerin, trimethylolethane, trimethylolpropane, trimethylolbutane, hexanetriol, pentaerythritol, and dipentaerythritol. These polyhydric alcohols may be used singly, or in mixture of two or more kinds thereof.

In a case in which such a polyester resin is used, it is preferable to blend the polyester resin with a curing agent because the hardness of the coated layer 102A is improved. As the curing agent, which is not particularly limited, either a commonly known amino resin or polyisocyanate compound, or both thereof are used.

The amino resin is not particularly limited, and examples thereof include resins obtained by reaction of urea, benzoguanamine, melamine, and the like with formaldehyde, and resins obtained by alkyl-etherifying urea, benzoguanamine, melamine, and the like with an alcohol. Specific examples of the amino resin include methylated urea resin, n-butylated benzoguanamine resin, and melamine resins (methylated melamine resin, n-butylated melamine resin, iso-butylated melamine resin, and the like).

Examples of resins widely used in the field of the coated metal substrate 10A include a polyester/melamine resin in which a polyester resin as a primary resin, and a melamine resin as a curing agent are used. Examples of melamine resins as used herein include at least one or more of methylated melamine resin, n-butylated melamine resin, or iso-butylated melamine resin.

The polyisocyanate compound is not particularly limited, and preferred examples thereof include isocyanate compounds blocked with blocking agents such as phenol, cresol, aromatic secondary amines, tertiary alcohols, lactam, and oxime. Still more preferred examples of the polyisocyanate compound include hexamethylene diisocyanate (HDI) and derivatives thereof, tolylene diisocyanate (TDI) and derivatives thereof, diphenylmethane diisocyanate (MDI) and derivatives thereof, xylylene diisocyanate (XDI) and derivatives thereof, isophorone diisocyanate (IPDI) and derivatives thereof, trimethylhexamethylene diisocyanate (TMDI) and derivatives thereof, hydrogenated TDI and derivatives thereof, hydrogenated MDI and derivatives thereof, and hydrogenated XDI and derivatives thereof.

The configuration of the coated layer 102A is not particularly limited, and it is preferable for enhancing the corrosion resistance of the cell structures 15 that the coated layer 102A is a layer in which at least one coating film contains a rust preventive pigment, in a case in which the coated layer 102A is a multilayer including two or more coating films.

The rust preventive pigment is not particularly limited, and examples thereof include known chromate-free rust preventive pigments such as phosphate-based rust preventive pigments (zinc phosphate, iron phosphate, aluminum phosphate, zinc phosphite, aluminum tri-polyphosphate, and the like), molybdate-based rust preventive pigments (such as calcium molybdate, aluminum molybdate, and barium molybdate), vanadium-based rust preventive pigments (vanadium oxide and the like), silicate-based rust preventive pigments (calcium silicate and the like), silica-based rust preventive pigments (water-dispersed silica, fumed silica, calcium ion exchanged silica, and the like), ferroalloy-based rust preventive pigments (ferrosilicon and the like); and known chromium-based rust preventive pigments such as strontium chromate, potassium chromate, barium chromate, and calcium chromate. From the viewpoint of environmental preservation in recent years, a chromate-free rust preventive pigment is preferable as the rust preventive pigment. These rust preventive pigments may be used singly, or in combination of plural kinds thereof.

The amount of added rust preventive pigment is preferably from 1 to 40 mass % with respect to the solid content standard of a coating film. In a case in which the amount of added rust preventive pigment is less than 1 mass %, corrosion resistance may be insufficiently improved. In a case in which the amount of added rust preventive pigment is more than 40 mass %, processability may be deteriorated, whereby a coating film may fall off during processing, and corrosion resistance tends to be also poor.

It is preferable that the coated metal substrate 10A is a coated metal substrate that is a product shipped to consumers in a state in which the coated layer 102A is formed on the base metal sheet 101A. Examples of such coated metal substrates 10A include a coated metal substrate in which the coated layer 102A is formed by coating the base metal sheet 101A with a coating, and a coated metal substrate in which the coated layer 102A is formed by laminating a resin film on the base metal sheet 101A. These coated metal substrates 10A have merits that are not possessed by post-coated metal sheets coated after processing. Examples of the merits include possible omission of coating steps in consumers, possible solution of public nuisance and environmental problems caused by coating waste and the like, and possible conversion of space for coating into other applications.

In the coated metal substrate 10A, a conversion treatment layer (not illustrated) may be disposed between the base metal sheet 101A and the coated layer 102A, if necessary. The conversion treatment layer is disposed for the purposes of, e.g., enhancing adhesiveness between the base metal sheet 101A and the coated layer 102A, and improving corrosion resistance. Examples of conversion treatments for forming the conversion treatment layer include known treatments such as zinc phosphate treatment, chromate treatment, silane coupling treatment, composite oxidation film treatment, chromate-free treatment, tannic acid-based treatment, titania-based treatment, zirconia-based treatment, Ni surface conditioning treatment, Co surface conditioning treatment, and mixed treatments thereof. Of the conversion treatments, chromate-free treatment is preferable from the viewpoint of environmental preservation.

In the coated metal substrate 10A, the base metal sheet 101A is not particularly limited, and examples thereof include metal sheets of iron, iron-based alloys, aluminum, aluminum-based alloys, copper, copper-based alloys, and the like. Examples of the base metal sheet 101A also include a plated metal sheet including an optional plated layer on a metal sheet. Of these metal sheets, the base metal sheet 101A is most preferably a metal sheet (steel sheet) including a zinc-based plated layer or an aluminum-based plated layer.

Examples of the zinc-based plated layer include galvanized layers, zinc-nickel plated layers, zinc-iron plated layers, zinc-chromium plated layers, zinc-aluminum plated layers, zinc-titanium plated layers, zinc-magnesium plated layers, zinc-manganese plated layers, zinc-aluminum-magnesium plated layers, and zinc-aluminum-magnesium-silicon plated layers. Further examples of the zinc-based plated layer also include plated layers obtained by allowing the plated layers to contain cobalt, molybdenum, tungsten, nickel, titanium, chromium aluminum, manganese, iron, magnesium, lead, bismuth, antimony, tin, copper, cadmium, arsenic, and the like as small amounts of different metal elements or impurities, and plated layers in which inorganic substances such as silica, alumina, and titania are dispersed.

Examples of the aluminum-based plated layer include aluminum plated layers, and plated layers of alloys of aluminum and at least one of silicon, zinc, or magnesium (for example, aluminum-silicon plated layers, aluminum-zinc plated layers, aluminum-silicon-magnesium plated layers, and the like).

A metal sheet including a multilayered plated layer in which a zinc-based plated layer or an aluminum-based plated layer, and another kind of plated layer (for example, iron plated layer, iron-phosphorus plated layer, nickel plated layer, cobalt plated layer, or the like) are layered one on another can be used as the base metal sheet 101A.

The plating method is not particularly limited. As the plating method, any method of known electroplating methods, hot-dip plating methods, vapor deposition plating methods, dispersion plating methods, vacuum plating methods, or the like is acceptable.

[Electricity Generation Unit 12A]

The electricity generation unit 12A includes an electricity-generating layer as the photoelectric conversion layer 121. Specifically, the electricity generation unit 12A includes, for example, the electricity-generating layer as the photoelectric conversion layer 121, the electron transport layer 122 disposed on a side, closer to the substrate electrode 11, of the electricity-generating layer, and the hole transport layer 123 disposed on a side, closer to the transparent electrode 13, of the electricity-generating layer (see FIG. 1). The electron transport layer 122 and the hole transport layer 123 are layers disposed, if necessary. The electricity generation unit 12A may include a layer other than the above-described layers, for example, a hole injection layer, an electron injection layer, an insulating layer, an antireflection layer, or the like.

The electricity-generating layer includes, for example, an organic semiconductor. The electricity-generating layer including an organic semiconductor can be produced by a method by which a film can be formed at low temperature (for example, a spin coating method or the like), rather than by a costly method such as vapor deposition.

Examples of the organic semiconductor include optional electron-donating p-type organic semiconductors and optional electron-accepting n-type organic semiconductors.

Such a p-type organic semiconductor is not particularly limited, and examples thereof include organic compounds such as P3HT (poly(3-hexylthiophene-2,5-diyl)), thiophene, phenylenevinylene, thienylene vinylene, carbazole, vinylcarbazole, pyrrole, isothianaphene, and heptadiene. Examples of the organic semiconductor also include polymers of the organic compounds and derivatives having, e.g., at least one group selected from the group consisting of hydroxyl, alkyl, amino, methyl, nitro, and halogen groups. Such p-type organic semiconductors may be used singly, or in combination of two or more kinds thereof.

Examples of such n-type organic semiconductors include PCBM ([6,6]-phenyl C61 butyric acid methyl ester), fullerene derivatives, and perylene derivatives. Of these n-type organic semiconductors, fullerene derivatives are particularly preferable because electrons especially rapidly transfer from a p-type organic semiconductor. Examples of such fullerene derivatives include derivatives of fullerene C60, derivatives of fullerene C70, and derivatives of fullerene C80. As the n-type organic semiconductors, commercially available products can be used. For example, a product manufactured by Sigma-Aldrich Co. LLC. or Frontier Carbon Corporation can be used as P3HT/PCBM.

The electron transport layer 122 includes an electron transport material. Examples of the electron transport material include zinc acetate, zinc(II) acetylacetonate, titanium isopropoxide, and titanium oxysulfate.

The hole transport layer 123 includes a hole transport material. Examples of the hole transport material include PEDOT/PSS, and metal oxides such as molybdenum oxide, nickel oxide, and tungsten oxide.

The film thickness of each layer included in the electricity generation unit 12A is not particularly limited, and may be determined in consideration of performance and a cost. For example, the film thickness of the electricity-generating layer is preferably from 50 to 400 nm, and more preferably from 100 to 300 nm. The film thicknesses of the electron transport layer 122 and the hole transport layer 123 are preferably from 80 to 300 nm, and more preferably from 100 to 250 nm.

[Others]

The configuration of the substrate electrode 11, the transparent electrode 13 as an upper electrode, and the sealing layer in the solar cell module is similar to that of the substrate electrode 11, the transparent electrode 13, and the sealing layer 14 described in the organic electronic device. Therefore, explanations thereof are omitted.

[Production Method]

The solar cell module 2 can be produced according to the method of producing the organic electronic device 1.

Examples of production of the solar cell module 2 in which the plurality of cell structures 15 (single cells) are linked onto the coated metal substrate 10A include 1) a procedure of producing a plurality of cell structures 15 on individual coated metal substrates 10A and connecting corresponding electrodes, 2) a procedure of forming a plurality of cell structures 15 on one coated metal substrate 10A and connecting the cell structures 15. For example, a method of producing films in belt shapes in the order of a substrate electrode 11, an electricity generation unit 12A, and a transparent electrode 13 on a coated metal substrate 10A is often adopted for producing the solar cell module 2 having the latter structure by a continuous process.

EXAMPLES

Examples which are examples of the invention will be described. The examples exemplify the invention, and are not intended to limit the invention.

Example A

Transparent electrodes of test numbers 1 to 57 shown in Table 1 to Table 3 were produced, and the sheet resistance values (Ω/sq) and light transmittances (%) of the transparent electrodes were investigated.

The transparent electrodes of the test numbers 1 to 22 were produced by the following method. Glass substrates were prepared. Then, conductive polymer dispersed liquids were prepared. As such a conductive polymer dispersed liquid, a PEDOT/PSS dispersion liquid (CLEVIOS P HC V4 (trade name) from H. C. Starck GmbH) was used. The solid content concentration of PEDOT/PSS in the dispersion liquid was 1.3 mass %. DMSO (manufactured by Aldrich Corporation) and a surfactant (denoted by "SF" (TRITON X-100 (trade name) manufactured by Aldrich Corporation) in Table 1 to Table 3) were added to the PEDOT/PSS dispersion liquid, if necessary. The details of the compositions of the dispersion liquids are shown in Table 1.

The prepared conductive polymer dispersed liquids were applied onto the glass substrates by a doctor blade method, whereby coating films were formed. Then, the coating films were dried at 120° C. for 20 minutes, to produce the transparent electrodes. The thickness of the conductive polymer layer of each transparent electrode was in a range of from 130 to 600 nm.

In the test numbers 23 to 57, carbon fibers (denoted by "CF" in Table 1 to Table 3) were added in addition amounts (percentages [mass %] in a case in which the components of the conductive polymer dispersion liquids excluding the carbon fibers were regarded as 100) shown in Table 2 to the conductive polymer dispersed liquids described above. The carbon fibers used are as follows. The details of the compositions of the dispersion liquids are shown in Table 2 to Table 3.

Test numbers 23 to 42: GRANOC CHOPPED FIBER (trade name) manufactured by Nippon Graphite Fiber Corporation (diameter=11 μm, length=3 mm)

Test numbers 43 to 57: GRANOC MILLED FIBER (trade name) manufactured by Nippon Graphite Fiber Corporation (diameter=11 μm, length=6 mm)

The conductive polymer dispersed liquids containing the carbon fibers were applied onto glass substrates by a drop-casting method, whereby coating films of the dispersion liquids were formed. Then, the coating films of the dispersion liquids were dried at 120° C. for 20 minutes, to produce transparent electrodes. Observation of cross sections of the transparent electrodes of the test numbers 23 to 57 with SEM showed that a part of each carbon fiber was embedded in a conductive polymer layer (PEDOT/PSS film) while the remainder was exposed from the conductive polymer layer.

The thicknesses of the conductive polymer layers of the produced transparent electrodes were measured according to the previously explained method, as shown in Table 1 to Table 3. Measurement of the carbon fibers (CF) of the transparent electrodes according to the previously explained method provided the area rates of the carbon fibers (CF) as shown in Table 1 to Table 3.

[Measurement of Content of Carbon Fibers]

The contents (mass %) of the carbon fibers (CF) in the produced transparent electrodes were determined by the following method. First, the light transmittances of the transparent electrodes were measured by a method described later. The masses of the carbon fibers were calculated from the light transmittances, and the contents (mass %) of the carbon fibers in the transparent electrodes were determined from the masses of the conductive polymer layers, separately calculated from the measured thicknesses of the conductive polymer layer. The measurement results are shown in Table 1 to Table 3.

[Test of Measuring Sheet Resistance Value]

The sheet resistance (Ω/sq) of the transparent electrode of each test number was determined by the following method. Specifically, the sheet resistance value was measured by a four-terminal four-point probe method using a LORESTA-GP MCP-T601 TYPE manufactured by Mitsubishi Chemical Analytech Co., Ltd.

[Test of Measuring Light Transmittance]

The light transmittance (%) of the transparent electrode of each test number was measured using a spectrophotometer (VARIAN CARY 4000 (trade name)) manufactured by Agilent Technologies Inc.

The details of each test are listed in Table 1 to Table 3. The differences between the sheet resistance values and light transmittance of test numbers of which the compositions of the conductive polymer dispersed liquids or the conductive polymer dispersed liquids containing carbon fibers (CF), and the thicknesses of the conductive polymer layers are the same (for example, test numbers 1 and 2, or test numbers 23 and 24) are caused by a lot-to-lot difference.

TABLE 1

| | Composition (mass %) of conductive polymer dispersed liquid | | | | Transparent electrode | | | | | | | | |
|---|---|---|---|---|---|---|---|---|---|---|---|---|---|
| | PEDOT/ | | | | Thickness (nm) of | CF | | | | | Sheet resistance value | Light trans- | |
| Test Number | PSS dispersion liquid | DMSO | SF | CF | conductive polymer layer | Diameter (μm) | Diameter ratio (times) | Length (mm) | Content (mass %) | Area rate (%) | (Ω/sq) | mittance (%) | Remarks |
| 1 | 94.5 | 5 | 0.5 | 0 | 81 | — | — | — | — | — | 206 | 90.7 | Comparative Example |
| 2 | 94.5 | 5 | 0.5 | 0 | 81 | — | — | — | — | — | 193 | 90.3 | Comparative Example |
| 3 | 94.5 | 5 | 0.5 | 0 | 163 | — | — | — | — | — | 153 | 89.2 | Comparative Example |
| 4 | 94.5 | 5 | 0.5 | 0 | 163 | — | — | — | — | — | 129 | 89.4 | Comparative Example |
| 5 | 94.5 | 5 | 0.5 | 0 | 27 | — | — | — | — | — | 598 | 99.8 | Comparative Example |
| 6 | 94.5 | 5 | 0.5 | 0 | 27 | — | — | — | — | — | 670 | 97.9 | Comparative Example |
| 7 | 94.5 | 5 | 0.5 | 0 | 135 | — | — | — | — | — | 1308 | 98.7 | Comparative Example |
| 8 | 94.5 | 5 | 0.5 | 0 | 135 | — | — | — | — | — | 783 | 97.3 | Comparative Example |
| 9 | 94.5 | 5 | 0.5 | 0 | 379 | — | — | — | — | — | 257 | 97.3 | Comparative Example |
| 10 | 94.5 | 5 | 0.5 | 0 | 379 | — | — | — | — | — | 410 | 94.1 | Comparative Example |
| 11 | 94.5 | 5 | 0.5 | 0 | 16 | — | — | — | — | — | 1899 | 100.0 | Comparative Example |
| 12 | 94.5 | 5 | 0.5 | 0 | 16 | — | — | — | — | — | 2646 | 99.3 | Comparative Example |
| 13 | 94.5 | 5 | 0.5 | 0 | 81 | — | — | — | — | — | 963 | 98.9 | Comparative Example |
| 14 | 94.5 | 5 | 0.5 | 0 | 81 | — | — | — | — | — | 1290 | 99.0 | Comparative Example |
| 15 | 94.5 | 5 | 0.5 | 0 | 228 | — | — | — | — | — | 1049 | 100.0 | Comparative Example |
| 16 | 94.5 | 5 | 0.5 | 0 | 228 | — | — | — | — | — | 721 | 98.3 | Comparative Example |
| 17 | 94.5 | 5 | 0.5 | 0 | 41 | — | — | — | — | — | 269 | 95.5 | Comparative Example |
| 18 | 94.5 | 5 | 0.5 | 0 | 41 | — | — | — | — | — | 337 | 92.3 | Comparative Example |
| 19 | 94.5 | 5 | 0.5 | 0 | 203 | — | — | — | — | — | 166 | 86.7 | Comparative Example |
| 20 | 94.5 | 5 | 0.5 | 0 | 203 | — | — | — | — | — | 179 | 85.0 | Comparative Example |
| 21 | 94.5 | 5 | 0.5 | 0 | 569 | — | — | — | — | — | 103 | 83.7 | Comparative Example |
| 22 | 94.5 | 5 | 0.5 | 0 | 569 | — | — | — | — | — | 101 | 82.6 | Comparative Example |

TABLE 2

| | Composition (mass %) of CF-containing conductive polymer dispersed liquid | | | | Transparent electrode | | | | | | | | |
|---|---|---|---|---|---|---|---|---|---|---|---|---|---|
| | PEDOT/PSS | | | | Thickness (nm) of | CF | | | | | Sheet resistance value | Light trans- | |
| Test number | dispersion liquid | DMSO | SF | CF | conductive polymer layer | Diameter (μm) | Diameter ratio (times) | Length (mm) | Content (mass %) | Area rate (%) | (Ω/sq) | mittance (%) | Remarks |
| 23 | 94.5 | 5 | 0.5 | 2 | 130 | 11 | 84.6 | 3 | 96.1 | 62 | 85 | 91.8 | Example |
| 24 | 94.5 | 5 | 0.5 | 2 | 130 | 11 | 84.6 | 3 | 96.1 | 62 | 59 | 77.6 | Example |
| 25 | 94.5 | 5 | 0.5 | 1.5 | 200 | 11 | 55.0 | 3 | 92.3 | 69 | 23 | 89.9 | Example |
| 26 | 94.5 | 5 | 0.5 | 1.5 | 200 | 11 | 55.0 | 3 | 92.3 | 69 | 59 | 81.1 | Example |
| 27 | 94.5 | 5 | 0.5 | 2 | 200 | 11 | 55.0 | 3 | 94.1 | 62 | 74 | 81.6 | Example |
| 28 | 94.5 | 5 | 0.5 | 2 | 200 | 11 | 55.0 | 3 | 94.1 | 62 | 19 | 81.6 | Example |
| 29 | 94.5 | 5 | 0.5 | 2.5 | 200 | 11 | 55.0 | 3 | 95.3 | 58 | 20 | 79.0 | Example |
| 30 | 94.5 | 5 | 0.5 | 2.5 | 200 | 11 | 55.0 | 3 | 95.3 | 58 | 12 | 80.7 | Example |
| 31 | 94.5 | 5 | 0.5 | 1.7 | 300 | 11 | 36.7 | 3 | 90.1 | 65 | 12 | 76.4 | Example |
| 32 | 94.5 | 5 | 0.5 | 1.7 | 300 | 11 | 36.7 | 3 | 90.1 | 65 | 12 | 75.6 | Example |
| 33 | 94.5 | 5 | 0.5 | 2.2 | 300 | 11 | 36.7 | 3 | 91.5 | 60 | 12 | 81.1 | Example |
| 34 | 94.5 | 5 | 0.5 | 2.2 | 300 | 11 | 36.7 | 3 | 92.2 | 60 | 15 | 70.5 | Example |
| 35 | 94.5 | 5 | 0.5 | 1.5 | 400 | 11 | 27.5 | 3 | 85.8 | 69 | 23 | 79.2 | Example |
| 36 | 94.5 | 5 | 0.5 | 1.5 | 400 | 11 | 27.5 | 3 | 85.8 | 69 | 21 | 79.8 | Example |
| 37 | 94.5 | 5 | 0.5 | 2 | 400 | 11 | 27.5 | 3 | 88.9 | 62 | 10 | 74.8 | Example |
| 38 | 94.5 | 5 | 0.5 | 2 | 400 | 11 | 27.5 | 3 | 88.9 | 62 | 11 | 77.7 | Example |
| 39 | 94.5 | 5 | 0.5 | 1 | 600 | 11 | 18.3 | 3 | 72.8 | 80 | 14 | 77.5 | Example |
| 40 | 94.5 | 5 | 0.5 | 1 | 600 | 11 | 18.3 | 3 | 72.8 | 80 | 17 | 79.2 | Example |
| 41 | 94.5 | 5 | 0.5 | 1.5 | 600 | 11 | 18.3 | 3 | 80.0 | 69 | 12 | 77.3 | Example |
| 42 | 94.5 | 5 | 0.5 | 1.5 | 600 | 11 | 18.3 | 3 | 80.0 | 69 | 12 | 76.7 | Example |

TABLE 3

| Test number | Composition (mass %) of CF-containing conductive polymer dispersed liquid | | | | Transparent electrode | | | | | | | |
|---|---|---|---|---|---|---|---|---|---|---|---|---|
| | | | | | Thickness (nm) of conductive polymer layer | CF | | | | Sheet resistance value (Ω/sq) | Light trans- mittance (%) | Remarks |
| | PEDOT/PSS dispersion liquid | DMSO | SF | CF | | Diameter (μm) | Diameter ratio (times) | Length (mm) | Content (mass %) | Area rate (%) | | | |
| 43 | 94.5 | 5 | 0.5 | 1.1 | 300 | 11 | 36.7 | 6 | 98.3 | 77 | 11 | 82.6 | Example |
| 44 | 94.5 | 5 | 0.5 | 1.7 | 300 | 11 | 36.7 | 6 | 98.9 | 65 | 27 | 77.3 | Example |
| 45 | 94.5 | 5 | 0.5 | 2.3 | 300 | 11 | 36.7 | 6 | 99.2 | 59 | 9 | 66.8 | Example |
| 46 | 94.5 | 5 | 0.5 | 2.4 | 300 | 11 | 36.7 | 6 | 99.2 | 59 | 8 | 71.7 | Example |
| 47 | 94.5 | 5 | 0.5 | 2.6 | 300 | 11 | 36.7 | 6 | 99.3 | 58 | 11 | 67.5 | Example |
| 48 | 94.5 | 5 | 0.5 | 1.1 | 400 | 11 | 27.5 | 6 | 97.8 | 77 | 13 | 82.6 | Example |
| 49 | 94.5 | 5 | 0.5 | 1.2 | 400 | 11 | 27.5 | 6 | 98.0 | 75 | 20 | 77.3 | Example |
| 50 | 94.5 | 5 | 0.5 | 1.5 | 400 | 11 | 27.5 | 6 | 98.4 | 69 | 11 | 66.8 | Example |
| 51 | 94.5 | 5 | 0.5 | 1.7 | 400 | 11 | 27.5 | 6 | 98.6 | 65 | 13 | 71.7 | Example |
| 52 | 94.5 | 5 | 0.5 | 2.2 | 400 | 11 | 27.5 | 6 | 98.9 | 60 | 7 | 67.5 | Example |
| 53 | 94.5 | 5 | 0.5 | 2.3 | 400 | 11 | 27.5 | 6 | 98.9 | 59 | 8 | 79.8 | Example |
| 54 | 94.5 | 5 | 0.5 | 1.1 | 600 | 11 | 18.3 | 6 | 96.7 | 77 | 19 | 81.9 | Example |
| 55 | 94.5 | 5 | 0.5 | 1.1 | 600 | 11 | 18.3 | 6 | 96.7 | 77 | 13 | 76.6 | Example |
| 56 | 94.5 | 5 | 0.5 | 1.5 | 600 | 11 | 18.3 | 6 | 97.6 | 69 | 8 | 73.2 | Example |
| 57 | 94.5 | 5 | 0.5 | 1.7 | 600 | 11 | 18.3 | 6 | 97.8 | 65 | 7 | 74.6 | Example |

[Test Results]

As shown by the test results in Table 1 to Table 3, each of the transparent electrodes of the test numbers 23 to 57 in which a plurality of carbon fibers having a diameter that is larger than the thickness of the conductive polymer layer were partially embedded in the conductive polymer layer had a low sheet resistance of 100 Ω/sq or less. In addition, each of the transparent electrodes of the test numbers 23 to 57 had a light transmittance of 65% or more. In contrast, each of the transparent electrodes of the test numbers 1 to 22 including no carbon fiber had a sheet resistance of more than 100 Ω/sq.

As shown by the sheet resistance values (from 101 to 2646 Ω/sq) of the transparent electrodes of the test numbers 11, 12, 21, and 22, a state in which carbon fibers hardly overlap one another in a conductive polymer layer occurs, the sheet resistance value of the single conductive polymer layer is dominant in the sheet resistance value of a transparent electrode, and the sheet resistance value of the transparent electrode may be more than 100 Ω/sq, in a case in which the ratio of the diameter of a carbon fiber to the thickness of the conductive polymer layer is less than 2 times. Therefore, it is preferable that the ratio of the diameter of the carbon fiber to the thickness of the conductive polymer layer is 2 times or more.

As shown by the sheet resistance values (from 101 to 103 Ω/sq) of the transparent electrodes of the test numbers 21 and 22, a state in which carbon fibers hardly overlap one another in a thick conductive polymer layer occurs, the sheet resistance value of the single conductive polymer layer is dominant in the sheet resistance value of a transparent electrode, and the sheet resistance value of the transparent electrode may be more than 100 Ω/sq, in a case in which the diameter of a carbon fiber is less than 2 μm. Therefore, it is preferable that the diameter of the carbon fiber is 2 μm or more.

As shown by the sheet resistance values (from 1899 to 2646 Ω/sq) of the transparent electrodes of the test numbers 11 and 12, a state in which the amount of conductive polymer that connects carbon fibers to each other is small, and a network of carbon fibers is hardly formed occurs, the sheet resistance value of a single conductive polymer layer is dominant in the sheet resistance value of a transparent electrode, and the sheet resistance value of the transparent electrode may be more than 100 Ω/sq, in a case in which the thickness of the conductive polymer layer is less than 5 nm. Therefore, it is preferable that the thickness of the conductive polymer layer is 5 nm or more.

As shown by the sheet resistance values (from 101 to 103 Ω/sq) of the transparent electrodes of the test numbers 21 and 22, a state in which a carbon fiber is short, and a network of carbon fibers is hardly formed occurs, the sheet resistance value of a single conductive polymer layer is dominant in the sheet resistance value of a transparent electrode, and the sheet resistance value of the transparent electrode may be more than 100 Ω/sq, in a case in which the length of the carbon fiber is less than 0.050 mm. Therefore, it is preferable that the length of the carbon fiber is 0.050 mm or more.

As shown by the sheet resistance values (from 101 to 103 Ω/sq) of the transparent electrodes of the test numbers 21 and 22, a state in which the number of carbon fibers is small, and a network of the carbon fibers is hardly formed occurs, the sheet resistance value of a single conductive polymer layer is dominant in the sheet resistance value of a transparent electrode, and the sheet resistance value of the transparent electrode may be more than 100 Ω/sq, in a case in which the area rate of the carbon fibers is less than 40%. Therefore, it is preferable that the area rate of the carbon fibers is 40% or more.

Example B

An organic thin-film solar cell (OPV) described below was produced in Example B.
 OPV of Example B1: OPV including, as an upper electrode, a transparent electrode including carbon fibers (CF) and a PEDOT/PSS film (hereinafter also abbreviated as "PEDOT/PSS+CF film")
 OPV of Comparative Example: OPV in which the upper electrode of OPV of Example B1 is replaced with a PEDOT/PSS film (hereinafter also abbreviated as "PEDOT/PSS+CF film")

Figure 5:
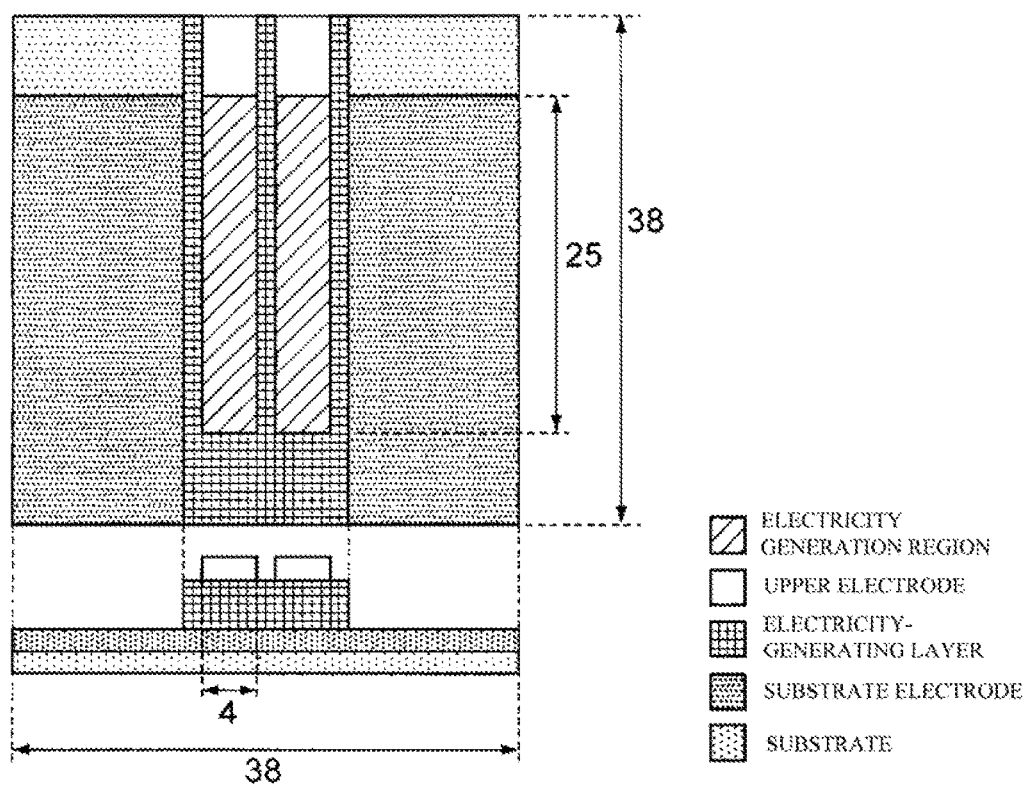
FIG. 5 is a view giving an explanation of a solar cell including two single cells (cell structures) produced experimentally in Example B.

Table 4 shows materials used in each layer of OPVs of Example B1 and Comparative Example, Table 5 shows film production conditions for producing the films of layers by spin coating, and FIG. 5 illustrates the various sizes (unit:

mm) of the produced solar cell (OPV). The electricity generation region of the produced OPV was 4×25 mm (area of 1 cm$^2$), as illustrated in FIG. 5. Heating in film production in each method other than a vapor deposition method was performed on a hot plate.

A film production solution for the upper electrode (transparent electrode) of OPV of Comparative Example [carbon fiber-containing conductive polymer dispersed liquid] contains no carbon fiber.

A substrate used in OPVs of Example B and Comparative Example was an insulating smooth PCM (insulating smooth coated metal sheet) including a coated layer including one clear coating film on one surface of a galvanized steel sheet. The substrate was the coated metal substrate, in which a value of the arithmetic mean roughness Ra of a surface of the coated layer was 12 nm, the minimum value of dynamic storage elastic modulus in the rubber-like elastic region of a clear coated layer was $1.2 \times 10^7$ Pa, the total film thickness of a coating film layer was 15 μm, and a leakage current value in application of a voltage of 100 V was $55 \times 10^{-7}$ A/cm$^2$.

Then, the following layers were produced on the substrate electrode by a spin coating method, to produce an electricity generation unit.

Electron transport layer (ZnO film): The precursor solution for an electron transport layer was stirred at 50° C. for 30 minutes, and a film was then produced, and was heated at 100° C. for 1 hour (dry film thickness of 60 μm).

Electricity-generating layer (P3HT/PCBM film): The film production solution for an electricity-generating layer was stirred at 50° C. for 6 hours, a film was then produced, and was subjected to natural drying for 30 minutes (dried film thickness of 200 μm).

Hole transport layer (PEDOT/PSS film): The film production solution for a hole transport layer was stirred at ordinary temperature for 6 hours, and a film was then produced (without requiring (drying step) (dried film thickness of 110 μm).

Subsequently, a transparent electrode was formed using the film production solution for an upper electrode (trans-

TABLE 4

| Produced layer | Abbreviation | Component material |
| --- | --- | --- |
| Film production solution for upper electrode (transparent electrode) | PEDOT/PSS | Poly(3,4-ethylenedioxythiophene)/polystyrene sulfonate |
| (Film production solution for PEDOT/PSS + CF film) | TRITON | TRITON-X100 |
| | DMSO | Dimethylsulfoxide |
| | CF | Carbon fiber |
| Film production solution for hole transport layer | PEDOT/PSS | Poly(3,4-ethylenedioxythiophene)/polystyrene sulfonate |
| (Film production solution for PEDOT/PSS film) | TRITON | TRITON-X100 |
| Film production solution for electricity-generating layer | P3HT | Poly(3-hexylthiophene-2,5-diyl) |
| | PCBM | [6,6]-Phenyl C61 butyric acid methyl ester |
| (Film production solution for P3HT/PCBM film) | CB | Chlorobenzene |
| Precursor solution for electron transport layer | Zn(acea)$_2$ | Zinc acetate |
| | AA | Acetylacetone |
| (Precursor solution for ZnO film) | MEA | Monoethanolamine |
| Film production solution for substrate electrode | PEDOT/PSS | Poly(3,4-ethylenedioxythiophene)/polystyrene sulfonate |
| (Film production solution for PEDOT/PSS film) | TRITON | TRITON-X100 |
| | DMSO | Dimethylsulfoxide |
| Insulating smooth PCM for substrate | — | Polyester-based coating, melamine resin, etc. |
| | GI | Galvanized steel sheet |

TABLE 5

| Layer produced by spin coating | Rotational speed (rpm) | Rotation time (sec) |
| --- | --- | --- |
| Substrate electrode (PEDOT/PSS film) | 300 | 60 |
| Electron transport layer (ZnO film) | 2000 | 60 |
| Electricity-generating layer (P3HT/PCBM film) | 700 | 60 |
| Hole transport layer (PEDOT/:PSS film) | 6000 | 60 |

Each OPV was produced as follows.

The insulating smooth PCM was cut to produce a substrate of 38×38 mm, the substrate was washed with distilled water and 2-propanol, and the film production solution for a substrate electrode (PEDOT/PSS dispersion liquid) was then applied to a coated surface by a spin coater (expected film thickness of 1 μm after drying) to form a substrate electrode.

parent electrode) (conductive polymer dispersed liquid containing carbon fibers). Specifically, in the case of OPV of Example B1, the same electrode as the transparent electrode of the test number 43 of Example A was formed as an upper electrode on the electricity generation unit (hole transport layer thereof) by a drop-casting method. In the case of OPV of Comparative Example, a carbon single layer electrode including a carbon film was formed as an upper electrode on the electricity generation unit (hole transport layer thereof) by a vacuum deposition method.

Each produced OPV was connected in series with an I-V measurement apparatus (W32-6244SOL3X manufactured by SYSTEMHOUSE SUNRISE CORP.), and was swept at voltages ranging from −1.0 V to 1.0 V, and a current value was measured. A solar simulator (XES-155S1 manufactured by SAN-EI ELECTRIC CO., LTD.) was used as a light source, and pseudo-sunlight of AM1.5G-100 mW/cm$^2$ was used. Irradiation of simulated sunlight was performed from an upper electrode side, and an I-V curve was obtained.

Figure 6:
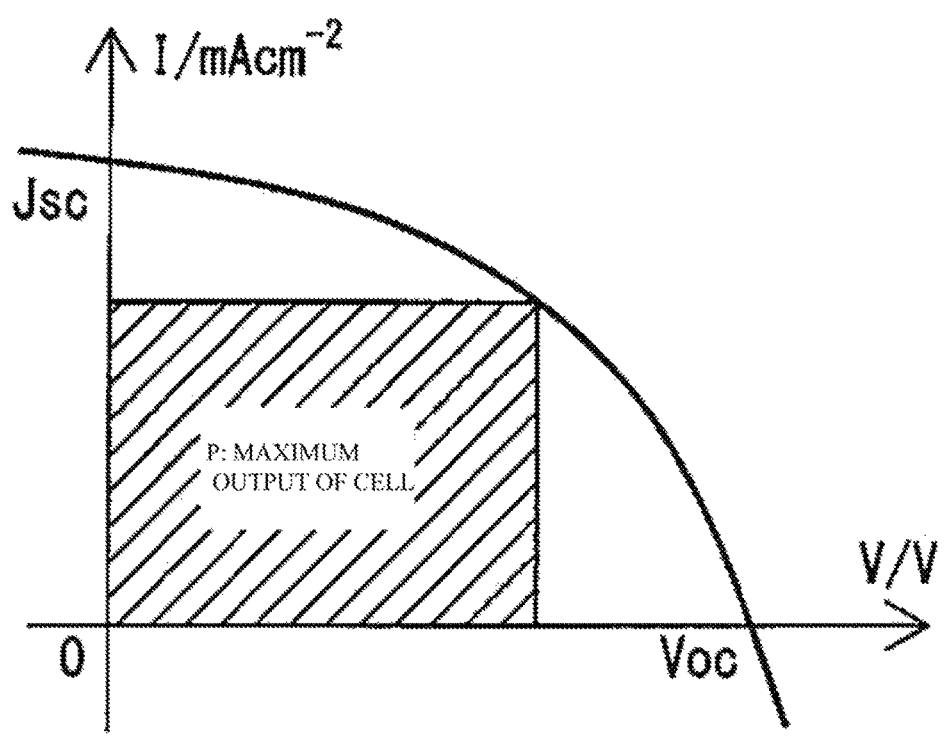
FIG. 6 is a schematic view for explaining an I-V curve of the solar cell produced experimentally in Example B.

A schematic view of the I-V curve is illustrated in FIG. 6. The I-V curve provides the following parameters.

Short-circuit photocurrent density Jsc: Photocurrent density (A/cm$^2$) at a voltage of 0

Open-circuit photovoltage Voc: Photovoltage (V) at s current of 0

Fill factor FF: P/(Jsc×Voc)

Power conversion efficiency PCE (%)=P/E×100 (in which P is the maximum electrical output (W/cm$^2$) of OPV, and E is the incident light power)

The parameters of the produced OPVs are shown in Table 6.

TABLE 6

| | | Example B1 | Comparative Example |
|---|---|---|---|
| Layer configuration | Upper electrode | PEDOT/PSS + CF film | Carbon film (C film) |
| | Hole transport layer | PEDOT/PSS film | PEDOT/PSS film |
| | Electricity-generating layer | P3HT/PCBM film | P3HT/PCBM film |
| | Electron transport layer | ZnO film | ZnO film |
| | Substrate electrode | PEDOT/PSS film | PEDOT/PSS film |
| | Substrate | Insulating smooth PCM (One-coat clear GI) | Insulating smooth PCM (One-coat clear GI) |
| Evaluation results | Jsc (mAcm$^{-2}$) | 0.27 | 0.04 |
| | Voc (V) | 0.03 | 0.07 |
| | FF | 0.25 | 0.26 |
| | PCE (%) | 0.002 | 0.0008 |

It is clear from the above that the fill factor FF and power conversion efficiency PCE of the OPV of Example B1 are improved in comparison with those of the OPV of Comparative Example.

As a result, it is clear that the electricity generation ability of the OPV is improved by the transparent electrode of Example.

The embodiment and Examples which are examples of the invention were described above. However, the embodiment and Examples described above merely exemplify the invention. Accordingly, the invention is not limited to the embodiment and Examples described above, and changes of the embodiment and Examples described above can be made without departing from the gist of the invention, if appropriate.

The entire disclosures of Japanese Patent Application No. 2014-078063 and Japanese Patent Application No. 2014-208285 are incorporated herein by reference.

All documents, patent applications, and technical standards described in this specification are herein incorporated by reference to the same extent as if each individual document, patent application, or technical standard was specifically and individually indicated to be incorporated by reference.

The invention claimed is:

1. A transparent electrode, comprising:
    a conductive polymer layer; and
    a plurality of carbon fibers having a diameter larger than a thickness of the conductive polymer layer,
    wherein the carbon fibers are partially embedded in the conductive polymer layer, and the thickness of the conductive polymer layer is from 5 to 650 nm, and
    wherein the diameter of the carbon fibers is from 18 to 90 times the thickness of the conductive polymer layer.

2. The transparent electrode according to claim 1, wherein the diameter of the carbon fibers is from 2 to 15 µm.

3. The transparent electrode according to claim 1, wherein lengths of the carbon fibers are from 50 to 7000 µm.

4. The transparent electrode according to claim 1, wherein an area rate of the carbon fibers, in a case of being viewed from a direction perpendicular to a plane of the transparent electrode, is from 40 to 90% with respect to the transparent electrode.

5. An organic electronic device, comprising:
    a substrate;
    a substrate electrode that is arranged on the substrate;
    an organic functional layer that is arranged on the substrate electrode; and
    the transparent electrode according to claim 1, the transparent electrode being arranged on the organic functional layer.

6. The organic electronic device according to claim 5, wherein the substrate is a coated metal substrate or a plastic substrate.

7. The organic electronic device according to claim 5, wherein the organic functional layer is an organic functional layer comprising an electricity-generating layer as a photoelectric conversion layer.

8. The organic electronic device according to claim 5, further comprising a sealing layer that seals the substrate electrode, the organic functional layer, and the transparent electrode.

9. The organic electronic device according to claim 5, wherein the diameter of the carbon fibers is from 35 to 90 times the thickness of the conductive polymer layer.

10. The organic electronic device according to claim 5, wherein the diameter of the carbon fibers is from 2 to 15 µm.

11. The organic electronic device according to claim 5, wherein lengths of the carbon fibers are from 50 to 7000 µm.

12. The organic electronic device according to claim 5, wherein an area rate of the carbon fibers, in a case of being viewed from a direction perpendicular to a plane of the transparent electrode, is from 40 to 90% with respect to the transparent electrode.

* * * * *